US009620658B1

(12) United States Patent
Spence et al.

(10) Patent No.: US 9,620,658 B1
(45) Date of Patent: Apr. 11, 2017

(54) INTEGRATED MODULAR PHOTOVOLTAIC BLANKET ASSEMBLY FOR SPACE SOLAR ARRAY (71) Applicants: Brian R Spence, Solvang, CA (US); Stephen F White, Ventura, CA (US); Mark V Douglas, Santa Barbara, CA (US); Kevin B Schmid, Santa Barbara, CA (US); Ron S Takeda, Santa Barbara, CA (US)

(72) Inventors: Brian R Spence, Solvang, CA (US); Stephen F White, Ventura, CA (US); Mark V Douglas, Santa Barbara, CA (US); Kevin B Schmid, Santa Barbara, CA (US); Ron S Takeda, Santa Barbara, CA (US)

(73) Assignee: Deployable Space Systems, Inc., Goleta, CA (US)

( * ) Notice: Subject to any disclaimer, the term of this patent is extended or adjusted under 35 U.S.C. 154(b) by 374 days.

(21) Appl. No.: 13/797,682

(22) Filed: Mar. 12, 2013

Related U.S. Application Data (60) Provisional application No. 61/610,410, filed on Mar. 13, 2012.

(51) Int. Cl.
H01L 31/044 (2014.01)
H02S 30/20 (2014.01)
H01L 31/041 (2014.01)

(52) U.S. Cl.
CPC .......... H01L 31/045 (2013.01); H01L 31/041 (2014.12); Y02E 10/50 (2013.01)

(58) Field of Classification Search
CPC ........ H01L 31/00–31/078; Y02E 10/50–10/60
USPC ................................... 136/243–265
See application file for complete search history.

(56) References Cited

U.S. PATENT DOCUMENTS

| 2008/0223429 A1* | 9/2008 | Everett | H01L 24/80 136/244 |
| 2010/0233843 A1* | 9/2010 | Frolov et al. | 438/98 |
| 2012/0073623 A1* | 3/2012 | Jones | H01L 31/02013 136/245 |

* cited by examiner

Primary Examiner — Bach Dinh
(74) Attorney, Agent, or Firm — R. Scott Kimsey, Esq.; Klein DeNatale Goldner (57) ABSTRACT A modular, lightweight, high-survivable, photovoltaic flexible blanket assembly for a space solar array is disclosed. The modular blanket is an accordion foldable or rollable flexible photovoltaic solar panel blanket assembly comprising a plurality of common photovoltaic modules spaced in an orthogonal pattern. Each module is mechanically attached with multiple low profile fasteners on their backside to an open weave mesh tensioned backplane structure. The backplane forms a tensioned dimensionally stable planar surface in the deployed configuration onto which the modules are suspended. Each module is common and comprised of a rectangular substrate that includes solar cell assemblies, circuitry, exposed electrical contacts for integration of blanket-level harnessing, and frontside and rearside shielding and coatings as required for the mission application. The blanket assembly may be dispersed with an open pattern of compliant and formable material on the backside to provide insulation against the vigorous vibration of the launch environment.

23 Claims, 4 Drawing Sheets

INTEGRATED MODULAR PHOTOVOLTAIC BLANKET ASSEMBLY FOR SPACE SOLAR ARRAY

FIELD OF THE INVENTION

The present invention relates to solar cell arrays for use on spacecraft and, in particular, solar cell arrays comprised of a photovoltiac flexible blanket panel assembly consisting of integrated common photovoltaic standard power modules for powering spacecraft during long life space missions.

BACKGROUND AND PRIOR ART

Spacecraft most commonly use photovoltaic solar cells to collect solar radiation and convert it into the electrical power necessary to operate the spacecraft. The solar cells are normally disposed on a solar array system. A solar array typically comprises one or more solar panels mechanically and electrically attached to each other and to the spacecraft. Each solar panel in an array typically comprises numerous individual photovoltaic solar cells, which are usually laid out in rows and connected together electrically at their adjacent edges. Most deployable solar arrays for spacecraft have used crystalline solar cells mounted to rigid honeycomb panels. Certain prior art describes mechanisms to effectively package, carefully deploy, and maintain the shape of rigid panel solar array designs. Flexible blanket solar arrays have also been used for crystalline solar cells, and are generally packaged in a long cylindrical roll or a foldable pleated stack that is deployed using separate or integrated mechanical structures.

Optimization of standard solar array systems, both structural and electrical subsystems, incorporating standard 140 um thickness multijunction solar cells with 100 um thick coverglass are approaching ~80 W/kg BOL specific power and ~13 kW/m$^3$ stowed packaging performance plateaus. Current state-of-the-art optimized solar array systems utilize heavy carbon composite honeycomb panel structures to provide necessary deployed and stowed strength and stiffness to meet mission requirements. Other promising solar array arrays that incorporate flexible blanket technologies with high-efficiency multijunction solar cells promise even higher specific power beyond 100 W/kg and more compact stowed packaging performance beyond 30 kW/m$^3$, allowing for more power to be packaged within a given launch volume envelope. These optimized structures and photovoltaic blanket subsystems are of less mass while stilling achieving typical stowed and deployed structural strength and stiffness performance. Furthermore, the solar cell panels on either a rigid panel or flexible blanket solar array construction account for nearly 80% of the cost of a space solar array system, and as such are a major target for cost reduction through the proposed embodiment.

To enable current and future spacecraft missions photovoltaic flexible blanket solar array technology must be affordable, modular, reliable, lightweight, accommodate standard and emerging photovoltaic solar cells, survivable and operable for over 15 years in multiple space environments (including thermal temperature extremes, proton and electron radiation, charged particle plasma environments, solar flares, atomic oxygen), operate at low 24 volt and high 600 volt voltages, low outgassing, stow within a compact volume for launch, provide dimensional stability, provide tensile load capability and long fatigue life, provide high strength and stiffness, provide insulating properties for the solar cell circuit, allow for good radiation and conduction properties to remove thermal heat.

The most notable flexible blanket solar arrays and their construction produced to date are: ATK's UltraFlex which is a radial rib structure with a tensioned single layer open weave mesh substrate blanket with an open backside circuit that is exposed to the environment; Lockheed Martin's Solar Array Flight Experiment (SAFE), International Space Station (ISS), and Milstar all of which are a central structure tensioned rectangular Kapton glass-reinforced laminated blanket; ESA/British Aerospace Hubble Space Telescope (HST) which is a dual-side structure tensioned rectangular Kapton glass-reinforced laminated blanket; AEG-Telefunken/Spar Aerospace L-SAT and Olympus which is a central structure with tensioned rectangular Kapton glass-reinforced laminated blanket; Northrop Grumman (TRW) EOS-AM/Terra and APSA which is a central structure with tensioned rectangular Kapton carbon-reinforced laminated blanket; and Boeing (Hughes) FRUSA which is a dual-sided structure tensioned rectangular Kapton glass-reinforced laminated blanket. With the exception of ATK's UltraFlex, all past solar array flexible blanket assemblies developed, built, and flown to date are constructed from a continuous area laminated frontside and backside polyimide/Kapton film with a heavy glass reinforcement core. Northrop Grumman's EOS-AM/Terra solar array implemented a lighter-weight carbon reinforcement core in place of the heavier glass material, but still employed a laminated construction. Northrop Grumman implemented carbon reinforcement within their blanket technology to further reduce mass and provide lower cell operating temperature through better thermal conductivity properties. ATK's UltraFlex flexible blanket assembly is very different and is constructed of a silicone coated glass fiber material where the solar cell circuit is directly bonded to the tensioned membrane glass fiber substrate, and the solar cell circuit is exposed on its backside with no dielectric for protection from the space environment. All these prior art flexible blankets are continuous area one-piece assemblies that are under significant tension on-orbit. The prior art one-piece blanket construction is not modular or reconfigurable and presents difficulty for rapid repair or re-configuration to a variety of planar aspect ratios. In the deployed configuration the prior art one-piece blanket assembly constructions are under significant tension on-orbit, and simultaneously the delicate solar cells and electrical interconnects are also in tension and not structurally isolated from the system. The fact that the delicate interconnected solar cells and circuits are in the load path presents a problem with respect to mechanical loading of the electrical subsystem which is not fundamentally designed to withstand significant loads. In prior art systems the interconnected solar cells, strings and circuits are exposed to additional mechanical loading which hinder reliability and can cause opening of electrical circuits. In addition to the aforementioned mechanical loading concerns within the electrical system, large thermal mismatches between the high thermal expansion polyimide based continuous blanket designs and the deployment structure are inherent drawbacks with these prior art flexible blanket solar arrays. In order to accommodate large thermal mismatches between the blanket and the structure complex tensioning mechanisms are required to prevent blanket and deployment structural mechanical failure. The proposed Integrated Modular Blanket Assembly (IMBA) embodiment eliminates these deficiencies associated with prior art flexible blanket technologies U.S. Pat. No. 5,298,085 to Harvey used on ATK's Ultra-Flex solar array discloses a flexible photovoltaic panel composed of a blanket substrate comprised of glass fiber reinforced open weave cloth, whereby the cloth is coated in silicone where each solar cell is directly bond to the glass fibers through the silicone, and a large portion of the solar cell backside is exposed. The Harvey embodiment produces an exposed solar cell circuit which promotes unwanted power loss through parasitic current collection when operating in charged particle plasma environments. This deficiency degrades the total power output capability of the Harvey embodiment when operating within plasma environments. To form a barrier between circuits and prevent arcing from adjacent strings for high voltage operations, in either plasma or normal space environments, typically the industry applies silicone adhesive grouting between the solar cell edges of adjacent circuits. Silicone grouting techniques between solar cells is well documented and is a suitable survivability design provision that enables high-voltage operation and mitigation against arcing. The Harvey embodiment with its open backside surface does not allow for grouting, and as such is not an ideal design for high voltage operability and arc mitigation. Another deficiency with the Harvey embodiment is that because the individual solar cells are bonded directly to the fiber reinforced substrate, whereby the fiber reinforced substrate is the tension load bearing structure, the interconnected solar cell circuits become exposed to unwanted mechanical and thermal stresses during operation in the deployed state, which in turn greatly reduces the solar cell circuits fatigue life and more likely would promote an open circuit condition rendering power loss to the spacecraft. Yet another deficiency of the Harvey embodiment is the large amount of exposed silicone material that is coated on the panel assembly backside, which is problematic for the end-user and a major source of contamination from volatile outgassing. Finally, the Harvey embodiment is not modular and is not produced from standard power modules (SPM's), but rather each individual solar cell is integrated to the blanket assembly as an independent component and not a higher level assembly. This produces a rather labor intensive construction of the Harvey embodiment which does not promote affordability.

U.S. Pat. No. 4,755,231 to Kurland describes a single film Kapton/polyimide material construction flexible blanket solar panel assembly. The assembly has additional means formed integrally, such as coatings or paint, on the exposed Kapton material for providing a ground path for electric charge building up and for providing a suitable heat emissive surface on the panel backside. The Kurland embodiment provides many improvements over Harvey in that it encapsulates the backside of the solar cell circuit which eliminates current losses when operating in charged particle plasma environments. The Kurland embodiment also greatly minimizes exposed silicones significantly reducing outgassing volatiles. The weakness of the Kurland embodiment is that blanket tension loads are transferred through the delicate and low strength Kapton/polyimide film material. This material has been known to structurally degrade and tear over a mission life making the application of this material as a structural member for a tensioned membrane flexible blanket not ideal. As such, this material as the primary load bearing membrane has been known to tear and rip sometimes resulting in catastrophic failure. Additionally, the Kapton/polyimide material has very high coefficient of thermal expansion and as such produces rather large dimensional instability on-orbit. Finally, the Kurland embodiment is not modular and is not produced from standard power modules (SPM's), but rather each individual solar cell is integrated to the blanket assembly as an independent component and not a higher level assembly. This produces a rather labor intensive construction of the Kurland embodiment which does not promote affordability.

U.S. Pat. No. 4,968,372 to Maass is an improvement to Kurland and describes a reinforced glass fiber Kapton/polyimide laminated based substrate for flexible blanket solar panels. The primary improvement features of Maas versus Kurland are the laminated construction of the flexible panel assembly with glass fiber filaments to provide strength and tearing resiliency under on-orbit tension loads, and better matched coefficient of thermal expansion with respect to the solar cell circuit and the deployment structure. The Maass construction is a similar panel construction used in some past and present flexible blanket solar arrays such as the Olympus, NASA International Space Station, and Milstar flexible blanket solar arrays. Other variations similar to the Maass embodiment, such as the NASA EOS-AM/Terra flexible blanket solar array, have employed the integration of carbon fiber reinforcement laminated within the Kapton/polyimide stack. The carbon fiber reinforcement is an improvement to the glass fiber in terms of providing lower mass, higher strength, better matched coefficient of thermal expansion, and better thermal conduction performance. Finally, the Maas embodiment is not modular and is not produced from standard power modules (SPM's), but rather each individual solar cell is integrated to the blanket assembly as an independent component and not a higher level assembly. This produces a rather labor intensive construction of the Kurland embodiment which does not promote affordability.

Current and prior art space solar arrays and solar cell panels, either rigid or flexible blanket construction, account for nearly 80% of the cost of a space solar array system, and as such are a targeted area for cost reduction through the preferred embodiment. Current processes for solar cell panel construction involve very labor intensive operations and many solar cell panels produced for space missions are custom constructions of differing panel geometries, solar cell and string features, and technologies. Current and prior art solar panel designs are also not modular, making it difficult to mass produce with economical automation processes or even traditional labor intensive processes. Additionally, with current solar panel technologies if one part is imperfectly produced it affects a larger part of the entire solar array system which must be reworked at considerable cost and schedule to the program. Current solar array panel technology does not have modular construction and repair and rework are cumbersome and expensive. The preferred embodiment, which utilizes common mass-produced standard power modules (SPM's), attacks the current technologies deficiencies and greatly enhances affordability and reliability through modularity, rapid production, and rapid rework capability.

SUMMARY

The preferred embodiment of the present invention provides a modular flexible photovoltaic solar array panel assembly, termed Integrated Modular Blanket Assembly (IMBA), which can be economically manufactured in high quantity and with high quality, and can be rapidly assembled for operation and rapidly disassembled for expedient repair or replacement. The single most component within space solar arrays that is unequivocally the highest cost and most time consuming to manufacture is the solar panel assembly which is comprised of; Photovoltaic solar cells, interconnection of the solar cells, installation of protective glass on the frontside of the solar cells, interconnection of individual solar cells to form a circuit or string, and the laydown of that circuit onto a panel substrate through an adhesive bonding processes. The preferred invention that produces a photovoltaic flexible blankets assembly is comprised of separate but identical multiple standard power modules (SPM's). In the preferred embodiment the implementation of SPM's enables mass production at extraordinary low cost, and rapid assembly or changeout during integration and test activities. A discrete tension load bearing backplane, which is purposely not laminated to the SPM's, is directly coupled to the deployment structure and forms the planar surface onto which the SPM's are individually attached. Multiple discrete low profile fasteners secure the SPM's to the backplane by sandwiching the backplane between the fastener and the SPM. The fasteners can be readily connected or disconnected to rapidly assemble or remove the SPM's from the backplane. Electrical harnessing is routed along the backside of the backplane and connects to exposed circuit termination pads on either the frontside or rearside of the SPM. The preferred embodiment substantially reduces the amount of production time to build a flexible blanket solar array assembly from many months to days. The preferred embodiment provides the end-user lightweight, broad power range capability, high reliability, compact stowed volume, rollable or accordion foldable architectures, high stiffness, modularity, broad reconfiguration, high survivability within extreme thermal and plasma space environments, high quality, thermal stability, high voltage operability, and game-changing affordability.

The above objectives are met by a modular, photovoltaic flexible blanket assembly for a space solar array comprising a unitary backplane structure, a plurality of photovoltaic modules having a substrate with solar cell assemblies laid onto the backplane structure, and a fastening system operable for mechanical attachment and detachment of the modules to the backplane structure. The backplane structure forms a flexible structure in the stowed configuration and a tensioned dimensionally stable planar surface in the deployed configuration. The modules include circuitry for incorporating the solar cell assemblies into a circuit for power production. The fastening system comprises a plurality of fasteners at discrete locations. One of the most important consequences of this new design is that upon deployment, the mechanical load on the backplane structure arising from the tensioning of the system is not imparted to any of the plurality of photovoltaic modules nor is tension imparted to the circuitry.

The unitary backplane structure may have an open weave fiber reinforced mesh.

The fasteners may comprise a low profile overlay bonded with adhesive that secures each of the modules to the backplane structure. It is important to emphasize the fact that the fasteners secure the modules to the backplane structure at discrete locations, they are not adhered to the backplane structure over a large contacting surface. The practice of fastening only at discrete locations (as opposed to adhering over a large surface area) serves to protect the modules from stress caused by tensioning of the blanket during deployment.

The circuit for power production may comprise a primary bus circuit and a series of electrical connections operable for electrically connecting each of the modules to the primary bus circuit. The electrical connections are also configured in such a way that they are not stressed by the tensioning of the blanket during deployment.

The blanket assembly has a front side and a backside. The back side may be partially covered by an open pattern of compliant, formable interleave material operable for the absorption of mechanical shock imparted to the blanket assembly in the stowed configuration.

Any of the above blanket assemblies may be rollable for the stowed configuration. Or, any of the above blanket assemblies may be accordion foldable for the stowed configuration.

DESCRIPTION

Glossary of Terms

Solar Array System—A combined structural and electrical system which is stowable in a small volume for shipment and launch, and that is deployed in space to expose a large surface area of photovoltaic solar cell devices to the sun, and that is mechanically and electrically attached to a spacecraft vehicle to provide power for spacecraft operations Flexible solar array—A solar array as described above that includes a rollable or foldable thin flexible blanket assembly or flexible panel assembly to which the photovoltaic solar cell devices and electrical circuitry are mounted.

Flexible photovoltaic (PV) blanket assembly—A thin flexible panel substrate that has mounted to it an array of photovoltaic solar cells and associated wiring that can be folded or rolled into a small and compact package for stowage; and is attached to the deployable solar array structure for unfurling during deployment into a flat, aligned, and tensioned planar configuration when fully deployed.

Deployable solar array structure—The structural components of a solar array that are attached to the flexible PV blanket ends and provide the motive force for blanket unfolding or unrolling deployments and deployed tensioning, and provide the primary deployed structural strength and stiffness characteristics of the solar array.

Solar cell rows—Numerous individual solar cells which are laid out in linear rows onto the flexible photovoltaic blanket assembly and connected together electrically at their adjacent edges. The number of solar cells that must be employed is a function of the anticipated spacecraft power demand, mission environment, and the solar cell efficiency.

Solar cell string—A sub-group of electrically interconnected solar cells that is arranged in a row, or multiple rows, in a serpentine or non-serpentine configuration. Electrical connection typically occurs at adjacent edges of the solar cells within the row where an exposed termination pad is present to provide a soldered, brazed, or welded electrical connection.

Substrate—A discrete panel substrate, preferable of dielectric material, onto which the solar cell strings are mounted onto that provides radiant heat transfer from its backside to the space environment, and within the preferred embodiment is attached and suspended to the frontside of the backplane with low profile fasteners to form a larger flexible blanket assembly that can be accordion folded or rolled.

Backplane—In the preferred embodiment the continuous one-piece planar structural portion of the flexible photovoltaic blanket assembly attached to the deployable solar array structure and tensioned when deployed; and comprised of continuous very-open weave mesh fiber, cloth, or polymeric material.

DESCRIPTION OF ITEMS IN FIGURES

101—Photovoltaic Flexible Blanket Panel Assembly—Flexible Blanket Assembly: The proposed embodiment of the Integrated Modular Photovoltaic Flexible Blanket Assembly for Space Solar Arrays.

102—Standard Power Module (SPM)—Module: Common mass produced subscale photovoltaic panel assembly inclusive of: Interconnected photovoltaic solar cells, electrically connectable termination pads, frontside shielding, frontside coatings as required, rearside shielding, rearside coatings as required, substrate with dielectric, circuit encapsulation provisions as required, and bonding adhesives.

103—Backplane: Tensioned membrane planar surface that provides the structural strength and stiffness of the Flexible Blanket Assembly (101) onto which the Standard Power Modules (102) are attached upon.

104—Fastener-SPM: Low profile fastener of sufficient area that attaches each Standard Power Module (102) in multiple locations onto the Backplane (103). The Backplane (103) is sandwiched between the SPM (102) and Fastener (104) and the SPM (102) mechanical connection is made through an Adhesive (109) bond.

105—Solar Cell: Photovoltaic device that converts incidence sunlight to electricity.

106—String or Circuit: Interconnected solar cells (105) or strings of interconnected solar cells (105) that create a circuit for power production which are laid down onto the Standard Power Modules (102) through bonding adhesive (111).

107—Substrate: A thin planar surface with adequate structural and thermal properties with at least a front surface having dielectric properties onto which the Solar Cells (105)/Strings (106) are laid down onto and attached with an Adhesive (111).

108—Interleave: Discrete or continuous interleave material, such as soft polyimide open-cell foam, corrugated Kapton, or other soft compliant material, placed on the backside of the Backplane (103) at appropriate locations so as to protect the solar cells (105, 106) within SPM's (102) from damage during launch vibration environments in the rolled or accordion folded stowed package configurations.

109—Adhesive-Fastener: Bondable adhesive, typically a silicone, used to attach the Fastener (104) onto the Backplane (103) and SPM (102), thereby adhering and securing the SPM (102) to the Backplane (103) and ensuring no exposed silicone material is present on the backside of the Backplane (103) to prevent unwanted blocking.

110—Grout-Adhesive: Bondable adhesive, typically a silicone, used to grout between adjacent Solar Cells (105) and Strings (106) on the SPM (102) to encapsulate and isolate the electrical circuit from the environment and mitigate against arcing during high voltage operation.

111—Adhesive-Cell/Substrate: Bondable adhesive, typically a thin silicone or an ultra-thin pressure sensitive adhesive (PSA), used to attach and adhere the Solar Cells/Solar Cell Strings (105, 106) onto the Substrate (107).

113—Adhesives-Interleave: Bondable adhesive, typically a silicone, used to attach and adhere the Interleave (108) onto the Backplane (103), thereby attaching and securing the Interleave (108) to the Backplane (103).

DESCRIPTION OF THE FIGURES

FIG. 2: Rearside deployed view of the preferred embodiment Photovoltaic Flexible Blanket Panel Assembly (101). The backside of the SPM's (102) rest on the frontside of the Backplane (103). The SPM's (102) are attached and adhered to the Backplane (103) with discrete and multiple low-profile Fasteners (104) and secured with bonding Adhesives (109). At the attachment locations, the Backplane (103) is sandwiched between the SPM (103) and the Fastener (104)/Adhesive (109) combination.

DETAILED DESCRIPTION OF PREFERRED EMBODIMENTS

A flexible integrated modular photovoltaic blanket assembly (101) for a solar array is disclosed. In a preferred embodiment the technology is an accordion foldable or rollable flexible photovoltaic solar panel blanket assembly (101) for a spacecraft comprising a plurality of common photovoltaic standard power modules (102) spaced in an orthogonal array. The modules are mechanically attached with multiple low profile fasteners (104, 109) on their backside to a tensioned continuous surface backplane structure (103) such that the backplane (103) structure is sandwiched between the modules (102) and multiple low profile fasteners (104, 109). Each module (102) comprises a rectangular substrate with solar cell assemblies (105, 106) laid onto the substrate (107). The substrate (107) includes circuitry for incorporating the solar cells into a circuit. The module (102) includes a pair of extended electrical leads carrying circuit connections for the circuitry that provide connections to a primary bus circuitry for power production and telemetry. In one embodiment, the blanket assembly (101) has an open pattern of low density interleave material (108, open cell foam, other soft compliant material), on the backside partially covering the blanket assembly (101) backside.

The preferred embodiment of the flexible integrated modular photovoltaic blanket assembly (101) has been specifically invented to significantly increase modularity, substantially reduce component and system-level cost, reduce weight, package in a cylindrical rolled or accordion folded stowed configuration, increase reliability, increase quality, provide broad adaptability to conventional flexible blanket solar arrays, and allow for rapid assembly, rapid repair, and rapid architecture reconfigure-ability. The preferred embodiment is constructed from mechanically and electrically interconnected mass-produced common standard power modules (102, SPM's) photovoltaic panel building blocks. The basic integrated modular photovoltaic flexible blanket assembly (101) and common SPM (102) building block approach is shown in FIG. 1, FIG. 2, and FIG. 3.

Figure 4:
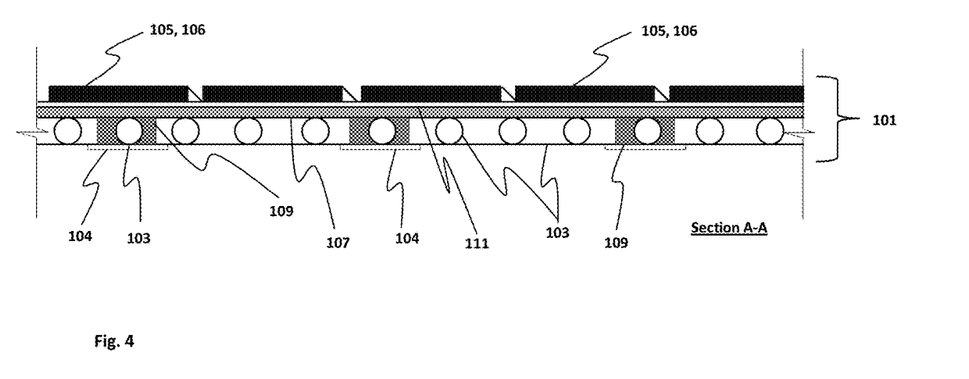
FIG. 4: Cross-Section A-A of FIG. 1 of the preferred embodiment Photovoltaic Flexible Blanket Panel Assembly (101), without the Interleave (108) and Grouting (110).

The common SPM (102) building blocks include interconnected solar cell assemblies (105, 106), frontside and rearside shielding/coatings, substrate (107) structure, diode protection for the solar cells and circuits, mechanical attachments (104, 109), and electrical interconnection interfaces and shown in FIG. 4. The common SPM's (102) being smaller scale photovoltaic panel assemblies can be readily mechanically and electrically connected, and disconnected, to form a variety of flexible blanket geometrical architectures and profiles. The SPM's are rectangular in configuration and can be readily electrically connected in parallel or series connections to meet particular end-of-life voltage power requirements that a given spacecraft mission requires.

Figure 1:
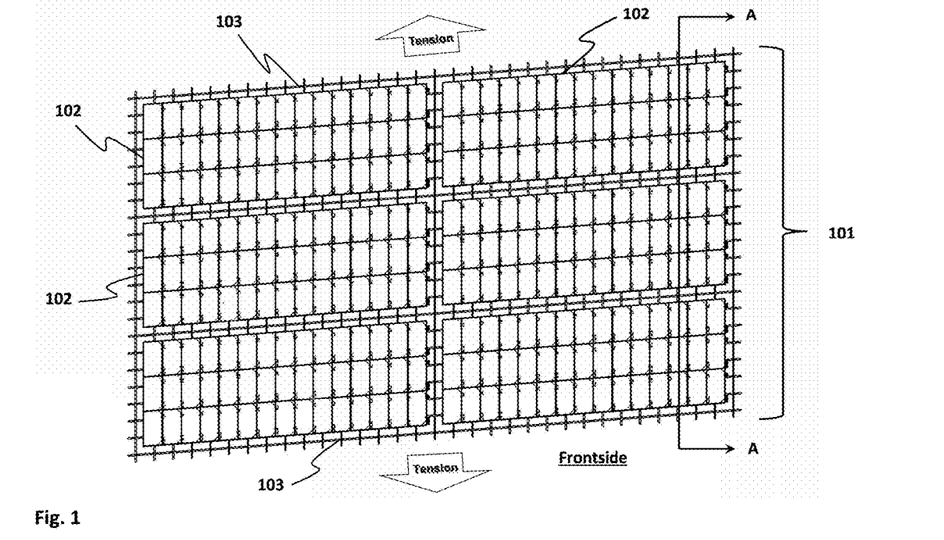
FIG. 1: Frontside deployed view of the preferred embodiment Photovoltaic Flexible Blanket Panel Assembly (101). The SPM's (102) with Solar Cell Strings (105, 106) facing outward are mounted on the frontside of the Backplane (103). The Backplane (103) is continuous one-piece construction and tensioned to form a planar surface, and is coupled to the solar array deployment structure.
Figure 2:
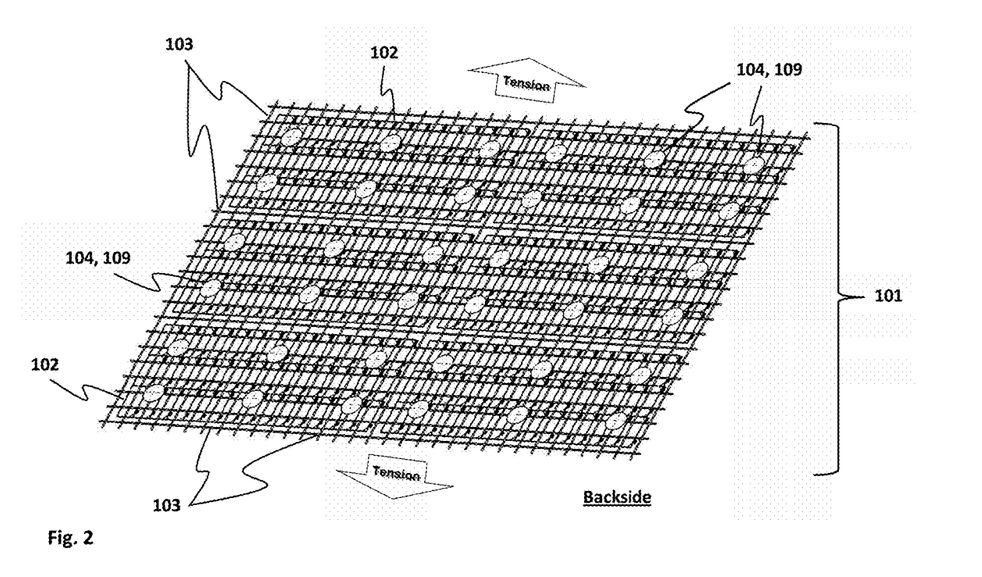
Figure 3:
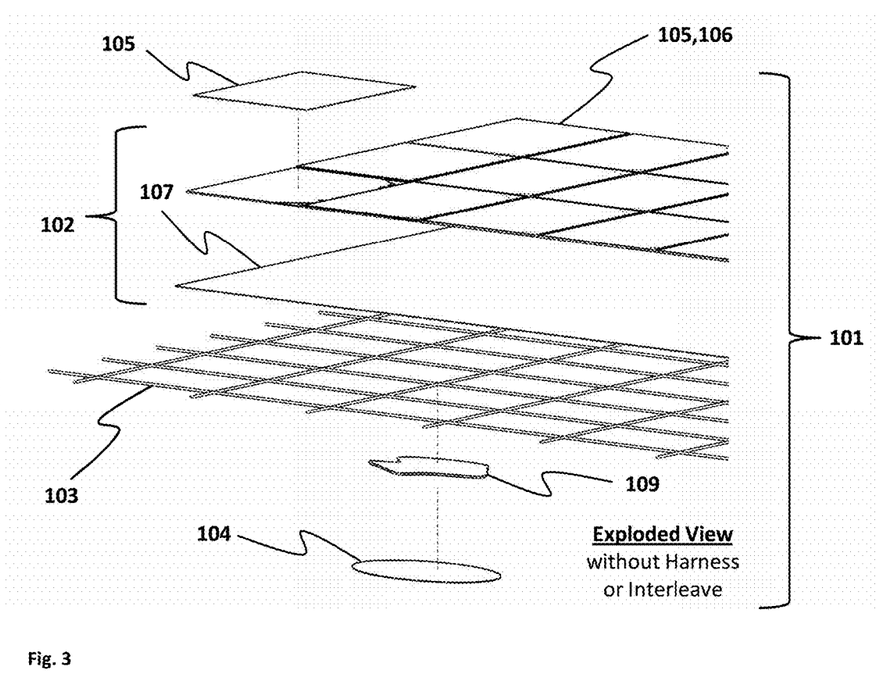
FIG. 3: Isometric exploded view of the preferred embodiment Photovoltaic Flexible Blanket Panel Assembly (101), without the Interleave (108) or Grouting (110).

Once the common SPM (102) is mass-produced and validated through test it is integrated to the Flexible Blanket Assembly (101) shown in FIG. 1, FIG. 2, and FIG. 3. A continuous planar surface that is tensioned and coupled to a lightweight deployment structure forms a dimensionally stable Backplane (103) for the common SPM's (102) to be attached upon. The Backplane (103) construction in the preferred embodiment is an open-weave fiber reinforced mesh material, however the design could be many other suitable designs of continuous construction.

Figure 5:
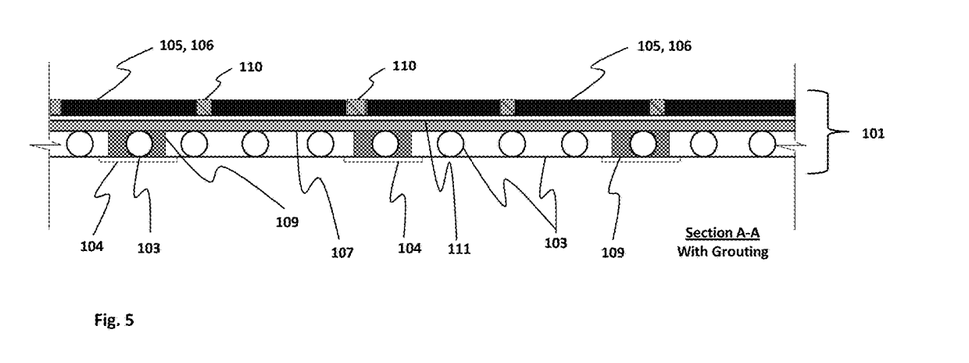
FIG. 5: Cross-Section A-A of FIG. 1 of the preferred embodiment Photovoltaic Flexible Blanket Panel Assembly (101) with Grouting (110) used to grout between adjacent Solar Cells (105) and Strings (106) on the SPM (102) to encapsulate and isolate the electrical circuit and mitigate against arcing during high voltage operation.
Figure 6:
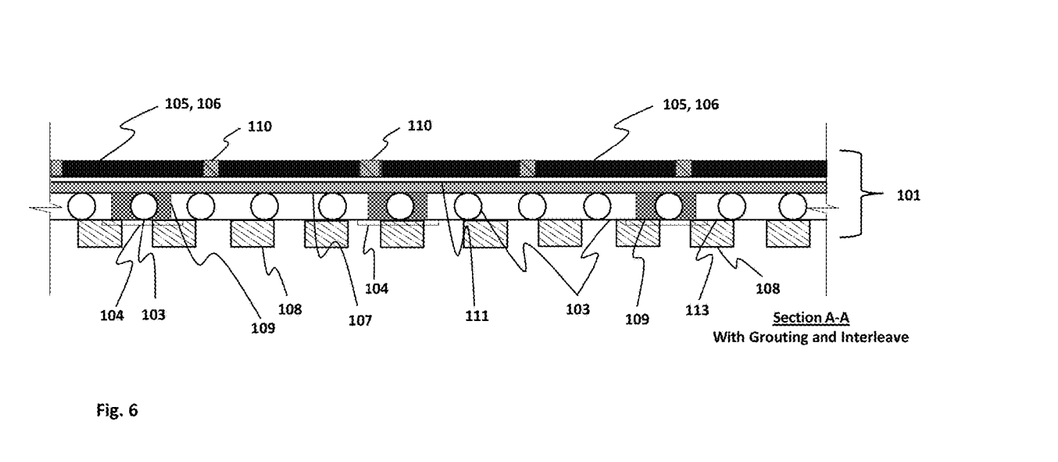
FIG. 6: Cross-Section A-A of FIG. 1 of the preferred embodiment Photovoltaic Flexible Blanket Panel Assembly (101) with discrete or continuous Interleave (108) material placed on the backside of the Backplane (103) at appropriate locations so as to protect the solar cells (105, 106) within the SPM's (102) from damage during launch vibration environments in the rolled or accordion folded stowed package configurations.

In the preferred embodiment the Backplane (103) is open thereby appreciably exposing the backside surface of the Substrate (107) of the SPM (103). The Substrate (107) is preferably a dielectric, such as polyimide Kapton or other dielectric materials, and may vary with backside surface coatings or impregnations to enhance environmental survivability or optimize thermal absorbtance and emittance properties. The interconnected high-volume-produced common SPM's (102) are suspended and attached on the Backplane (103) frontside planar surface. Mechanical connection of the SPM (102) to the Backplane (103) occurs through a series of discrete low profile disk shaped fasteners (104) that are bonded with an adhesive (109), thereby attaching and securing the SPM (102) to the Backplane (103) as shown in FIG. 4, FIG. 5, and FIG. 6. Electrical interconnection occurs from SPM (102) to SPM (102) through a low-profile electrical connector or a lap joint that is welded, soldered, or brazed. The circuits or strings from each SPM (102), or multiple connected SPM's (102), are grouped at the primary power harness which parallel the Flexible Blanket Assembly's (101) length. Harness can be routed along the backside of the Flexible Blanket Assembly (101), along its edges, or along both regions.

In the preferred embodiment the common SPM (102) approach allows for rapid repair and change-out, very-low production cost, and high-volume production capability. In the event an anomaly occurs within the Flexible Blanket Assembly (101), then the simple corrective action involves merely replacing the anomalous SPM (102) with a pristine SPM (102), as opposed to conducting expensive and time consuming individual solar cell (105) replacement rework through conventional labor intensive techniques. Repair and rework of an anomalous SPM (102) is more easily accomplished with the proposed embodiment construction. Typically for current and prior art technologies the damaged solar cells must be removed from the panel assembly very carefully and without damage to the panel substrate or the adjacent solar cells that are pristine. The common repair and rework technique involves chiseling out the damaged solar cell(s) from the complex panel construction of a conventional solar array. Often there is residual damage the adjacent solar cells and the substrate during this repair operation. In the proposed embodiment chiseling is not required, rather the damaged solar cell (105) and its associated Substrate (107) onto where it is attached can be completely cut out from the SPM (102) construction without damage to adjacent solar cells (105, 106) and without compromising the Substrate (107) of the SPM (102), since it is never subjected to significant mechanical loading within the design. In the preferred embodiment the new solar cell (105) is installed and electrically interconnected in its place, and the electrical interconnection can be performed by accessing both the frontside and backside of the SPM (102) as there is unobstructed access to perform this operation. In the preferred embodiment, once the reworked solar cell (105) is completely in place and electrically connected, the backside of the replaced solar cell (105) is then covered with a Substrate (107) patch that is adhered over and onto the primary Substrate (107).

In the preferred embodiment the common SPM (102) is manageable in size allowing for complete automated manufacture and insitu testing at the SPM-level (102). Broad qualification and acceptance testing can be readily and more affordably performed at the SPM-level (103), such as electrical performance verification at hot temperature and thermal vacuum cycling, allowing for testing at a lower subsystem level to further increase reliability and quality. Testing at a lower subsystem level is desired for space solar arrays as any non-conformance found is best uncovered prior to the top-level assembly where significant time and cost will have been expended to reach that higher assembly level.

The implementation of the common SPM (102) building-block design as the basic foundation for the proposed embodiment enables this technology to be very low cost and rapidly reconfigurable because of the designs high-volume mass-production capability. Since the SPM (102) is standard, the same and common, it can be produced on an automated manufacturing production line and validated through test as a subassembly prior to integration at the solar array wing level. Performing validation tests at the lowest subsystem level prior to system-level integration is how practically every non-space high-volume production industry operates. By testing at the lowest level the end user is assured that the assembly will function at the highest system level once integrated. This subscale SPM (102) testing eliminates the need for expensive rework at the system level if an unfortunate anomaly is uncovered after final integration, and maximizes rapid assembly, integration, and test of the Flexible Blanket Assembly (101). Uncovering an anomaly at the final integrated system-level is at the worst time of the production process and is most costly to the program. The preferred embodiment Flexible Blanket Assembly (101) allows for high-production efficiencies to be realized.

In the preferred embodiment the Flexible Blanket Assembly (101) can be packaged in an accordion folded configuration or in a rolled configuration for stowage. For accordion foldable Flexible Blanket Assemblies (101) blanket folding and hinging occurs between SPM (102) rows. The Backplane (103) region where the SPM's (102) are not covering its surface acts as a living hinge and the folding only occurs within the Backplane (103) material and not within the SPM's (102). For rollable Flexible Blanket Assemblies (101) the entire assembly is rolled and wrapped onto a cylindrical mandrel for stowage into a compact volume, whereby the Backplane (103) and SPM's (102) are rollable.

An important feature of the preferred embodiment Flexible Blanket Assembly (101) is that the primary blanket tension and major loading remain in the continuous Backplane (103) structure and not in the SPM's (102), or more importantly not in the solar cells (105), strings (106), and solar cell circuits. In the preferred embodiment the SPM's (102), solar cells (105), and strings (106) and circuits experience only negligible loading. The preferred embodiment provides a Flexible Blanket Assembly (101) in which internal mechanical and thermal stresses in the critical solar cells (105), strings and circuits (106), and SPM's (102) are substantially negligible when compared current and prior art technologies.

In the preferred embodiment the continuous Backplane (103) is tensioned and coupled to the lightweight solar array deployment structure to form a dimensionally stable and structurally stiff planar surface. The Backplane (103) is comprised of low thermal expansion material and is tensioned by spring-loaded elements coupled to the deployment structure that provide sufficient stroke to maintain blanket tension over the entire range of structural and thermal environments over the missions life. Unlike current and prior art systems that exhibit rather large on-orbit dimensional instability due to large thermal expansion and contraction characteristics, the low thermal expansion Backplane (103) primary load path carrier remains very dimensionally stable. The lack of any significant mechanical tension and thermal loading within the SPM's (102) eliminate the need for a composite fiber reinforced substrate backing structure within the SPM construction (102), allowing for use of ultra-lightweight and low strength Substrate (107) materials such as Kapton polyimide or other dielectric film materials. In the preferred embodiment SPM (102) tearing or mechanical failure from micro-meteorite orbital debris impingement, mechanical loading, thermal loading, or other external loading is not a concern because the SPM (102) never experiences significant tension loading in the stowed or deployed configurations, and as such the SPM's (102) do not need to be of laminated construction with fiber reinforcement, whereby current and prior art does. Additionally, in the preferred embodiment the SPM's (102) are completely free of exposed adhesives on their backside surfaces which greatly reduces outgassing volatiles and allows for optimization of optical surface properties through special coatings or Substrate (107) materials selection.

In the preferred embodiment protection of the solar cells (105, 106) from the launch vibration environment is achieved with discrete soft compliant Interleave (108) material located and attached on the Backplane (103) backside with adhesive (113) as shown in FIG. 6. Alternatively, the Interleave (108) can also be separate and not attached to the backside of the Flexible Blanket Assembly (101). In the preferred embodiment the Interleave (108) material is soft open-cell polyimide foam, or another soft material that is collapsible, dimensionally compliant, and exhibits high structural damping characteristics under loading. In the preferred embodiment the Interleave (108) is implemented as discrete buttons, discrete strips, or discrete sheets attached with adhesive (113) to the backside of the Flexible Blanket Assembly (101), or discrete sheets not attached to the Flexible Blanket Assembly (101). In the preferred embodiment the compliant Interleave (108) controls spacing of the Flexible Blanket Assembly (101) wraps in the stowed package for rollable blanket configurations or provides, a releasable compliant layer in the stowed package for accordion-foldable blanket configurations. The Interleave (108) prevents inter-layer snagging or blocking of adjacent blanket wraps or folds. Most importantly the Interleave (108) provides damping from the launch vibration environment for both the rollable and accordion foldable Flexible Blanket Assembly (101) and protects delicate solar cells (105, 106) and SPM's (102) during launch vibration and shipping transportation loads.

To form a barrier between solar cells (105), strings (106) and circuits, and prevent arcing between adjacent solar cell strings (105, 106) for high voltage operations in plasma environments the preferred embodiment allows for the accommodation of Grouting Adhesives (110) within the Flexible Blanket Assembly construction (101) as shown in FIG. 5 and FIG. 6. The Grouting (110) in the preferred embodiment is typically a silicone adhesive material, alternatively other low outgassing low temperature capability materials could be implemented.

Additionally, the design could also accommodate a continuous frontside cover over the entire surface of the solar cells (105) and strings (106) that is laminated to the backside Substrate (107) to fully encapsulate and isolate the electrical photovoltaic system.

The significance of the preferred embodiment provides a revolutionary and positive performance impact to the end-user in terms of: Affordability, lightweight, high modularity, highly adaptability for implementation into other commercially available flight-qualified flexible blanket solar arrays, compact stowage volume, high user flexibility, high durability and robust construction, implementation into rollable or accordion foldable flexible blanket configurations, high strength capability, negligible loading within the photovoltaic solar cells through the innovative SPM implementation and suspended attachment, applicability and scalability to many missions, adaptable to many photovoltaic solar cell types including crystalline and thin film devices, high voltage operation through inherent design features that allow for circuit encapsulation and isolation, rapid assembly, rapid reconfiguration capability, rapid repair capability, and high space environmental survivability.

The invention claimed is:
1. A modular, photovoltaic flexible blanket assembly for a deployable space solar array comprising:
   a. a unitary backplane structure, the backplane structure comprising a forward planar surface and a rearward planar surface and forming a flexible structure in a stowed configuration and a tensioned dimensionally stable planar surface in a deployed configuration,
   b. a plurality of photovoltaic modules having a substrate with solar cell assemblies laid onto the forward planar surface of the backplane structure, the modules including circuitry for incorporating the solar cell assemblies into a circuit for power production; and c. a fastening system operable for mechanical attachment and detachment of the photovoltaic modules to the backplane structure, the fastening system comprising a plurality of fasteners attached to the rearward planar surface of the backplane structure at discrete locations, such that upon deployment from a spacecraft into the deployed configuration, a mechanical load on the backplane structure arising during or following the deployment is not imparted to any of the plurality of photovoltaic modules nor to the circuitry, wherein each of the plurality of photovoltaic modules attaches to the forward planar surface of the backplane structure and to one of said plurality of fasteners via an adhesive.

2. A flexible blanket assembly as in claim 1 wherein the unitary backplane structure is an open weave fiber reinforced mesh comprising a plurality of openings defined therethrough, wherein at least a portion of the substrate of each of said plurality of photovoltaic modules is exposed through one of said plurality of openings defined through said unitary backplane structure.

3. A flexible blanket assembly as in claim 1 wherein each of the fasteners comprises a low profile overlay bonded with said adhesive, the adhesive being operable for securing each of the photovoltaic modules to the backplane structure.

4. A flexible blanket assembly as in claim 1 wherein the circuit for power production comprises a primary bus circuit and a series of electrical connections operable for electrically connecting each of the modules to the primary bus circuit.

5. A flexible blanket assembly as in claim 1 wherein the rearward planar surface of the backplane is partially covered by an open pattern of compliant, formable interleave material operable for the absorption of mechanical shock imparted to the blanket assembly in the stowed configuration.

6. A flexible blanket assembly as in claim 1 wherein the blanket assembly is operable for being rolled into the stowed configuration.

7. A flexible blanket assembly as in claim 1 wherein the blanket assembly is operable for being accordion folded into the stowed configuration.

8. A flexible blanket assembly as in claim 2 wherein each of the fasteners comprises a low profile overlay bonded with said adhesive, the adhesive being operable for securing each of the photovoltaic modules to the backplane structure.

9. A flexible blanket assembly as in claim 2 wherein the circuit for power production comprises a primary bus circuit and a series of electrical connections operable for electrically connecting each of the modules to the primary bus circuit.

10. A flexible blanket assembly as in claim 8 wherein the circuit for power production comprises a primary bus circuit and a series of electrical connections operable for electrically connecting each of the modules to the primary bus circuit.

11. A flexible blanket assembly as in claim 10 wherein the rearward planar structure of the backplane is partially covered by an open pattern of compliant, formable interleave material operable for the absorption of mechanical shock imparted to the blanket assembly in the stowed configuration.

12. A flexible blanket assembly as in claim 10 wherein the blanket assembly is operable for being rolled into the stowed configuration.

13. A flexible blanket assembly as in claim 10 wherein the blanket assembly is operable for being accordion folded into the stowed configuration.

14. A flexible blanket assembly as in claim 11 wherein the blanket assembly is operable for being rolled into the stowed configuration.

15. A flexible blanket assembly as in claim 11 wherein the blanket assembly is operable for being accordion folded into the stowed configuration.

16. A deployable space solar array comprising:
a photovoltaic blanket structure comprising:
a unitary, open backplane having a frontward side and a rearward side;
a plurality of photovoltaic modules, each photovoltaic module comprising a solar cell and a dielectric substrate disposed on a rearward side of said solar cell, wherein the plurality of photovoltaic modules are disposed on the frontward side of the backplane; and
a plurality of low-profile fasteners disposed on the rearward side of the backplane, wherein the plurality of low-profile fasteners are attached to the plurality of photovoltaic modules with an adhesive and the backplane is disposed between the plurality of photovoltaic modules and the plurality of low-profile fasteners, and further wherein the space solar array is configured to extend from a first, stowed configuration to a second, deployed configuration, wherein when the space solar array is in the second, deployed configuration the backplane forms a tensioned, dimensionally-stable structure.

17. The deployable space solar array according to claim 16, wherein the backplane comprises an open mesh structure comprised of a plurality of intersecting strands, and further within said plurality of photovoltaic modules and said low-profile fasteners are attached at intersections of the intersecting strands.

18. The deployable space solar array according to claim 16, wherein the backplane comprises a plurality of openings configured to substantially expose a rearward side of the dielectric substrate in order to provide radiant heat transfer to a space environment.

19. The deployable space solar array according to claim 16, further comprising a compliant interleave attached to the rearward side of said backplane for protection of said photovoltaic modules from vibration during a launch when the deployable space array is in the stowed configuration.

20. A deployable space solar array comprising:
a unitary, open backplane comprising a frontward side and a rearward side;
a photovoltaic module; and
a low-profile fastener,
wherein the low profile fastener is attached to the photovoltaic module with an adhesive resulting in a laminated structure comprising, in relative order, the photovoltaic module, the backplane and adhesive combination, and the low-profile fastener.

21. The deployable space solar array according to claim 20, wherein the backplane comprises an open mesh structure comprised of a plurality of intersecting strands forming a plurality of intersections, and further wherein the low-profile fastener attaches the photovoltaic module to the backplane at an intersection.

22. The deployable space solar array according to claim 21, wherein the space solar array is configured to extend from a first, stowed configuration to a second, deployed configuration, and further wherein when the space solar array is in the second, deployed configuration the backplane forms a tensioned, dimensionally-stable structure.

23. The deployable space solar array according to claim 22, further comprising a compliant interleave attached to the rearward side of said backplane for protection of said photovoltaic modules from vibration during a launch when the deployable space array is in the stowed configuration.

* * * * *